United States Patent [19]
Gardner et al.

[11] Patent Number: 6,146,934
[45] Date of Patent: *Nov. 14, 2000

[54] SEMICONDUCTOR DEVICE WITH ASYMMETRIC PMOS SOURCE/DRAIN IMPLANT AND METHOD OF MANUFACTURE THEREOF

[75] Inventors: Mark I. Gardner, Cedar Creek; H. Jim Fulford; Jack C. Lee, both of Austin, all of Tex.

[73] Assignee: Advanced Micro Devices, Inc., Sunnyvale, Calif.

[ * ] Notice: This patent is subject to a terminal disclaimer.

[21] Appl. No.: 08/994,818

[22] Filed: Dec. 19, 1997

[51] Int. Cl.7 ...................... H01L 21/8238; H01L 21/336
[52] U.S. Cl. .................... 438/230; 438/231; 438/232; 438/286
[58] Field of Search .................... 438/230, 231, 438/232, 286, 305

[56] References Cited

U.S. PATENT DOCUMENTS

| | | |
|---|---|---|
| 4,683,645 | 8/1987 | Naguib et al. . |
| 4,835,112 | 5/1989 | Pfiester et al. . |
| 5,208,179 | 5/1993 | Okazawa ............................................. 437/52 |
| 5,362,670 | 11/1994 | Iguchi et al. . |
| 5,432,114 | 7/1995 | O .............................................. 437/36 |
| 5,444,279 | 8/1995 | Lee .......................................... 257/316 |
| 5,497,021 | 3/1996 | Tada ........................................ 257/369 |
| 5,498,577 | 3/1996 | Fulford, Jr. et al. ..................... 437/228 |
| 5,532,181 | 7/1996 | Takebuchi et al. ........................ 437/43 |
| 5,602,045 | 2/1997 | Kimura . |
| 5,677,224 | 10/1997 | Kadosh et al. ............................. 437/57 |
| 5,710,055 | 1/1998 | Kizilyalli .................................. 437/45 |
| 5,716,863 | 2/1998 | Arai ........................................... 437/43 |
| 5,770,485 | 6/1998 | Gardner et al. . |
| 5,858,864 | 1/1999 | Aronowitz et al. ...................... 438/528 |

FOREIGN PATENT DOCUMENTS

| | | | |
|---|---|---|---|
| 08330436 | 12/1996 | Japan ....................................... 21/832 |
| WO 85/00694 | 2/1985 | WIPO . | |

OTHER PUBLICATIONS

S. Wolf, "MOS Devices and NMOS Process Integration", *Silicon Processing For The VLSI Era*—vol. II, pp. 354–363 (1990).

Primary Examiner—Donald L. Monin, Jr.
Assistant Examiner—S. H. Rao

[57] ABSTRACT

A PMOS or CMOS device includes an active region with a shallow heavy atom p-type implant. The PMOS device has a substrate, at least one gate electrode disposed on the substrate, and first and second doped active regions disposed adjacent to the gate electrode. The first active region has a higher concentration of a p-type heavy atom dopant material than the second active region. In one method of forming the PMOS device, spacers are formed on sidewalls of the gate electrode. A first p-type dopant material is selectively implanted into active regions adjacent to the gate electrode using the spacers as a mask. Then a portion of one of the spacers is removed to form a thinner spacer and a second p-type dopant material is selectively implanted into a first one of the active regions using the thinner spacer as a mask. The second p-type dopant material is a heavy atom species.

33 Claims, 9 Drawing Sheets

6,146,934

SEMICONDUCTOR DEVICE WITH ASYMMETRIC PMOS SOURCE/DRAIN IMPLANT AND METHOD OF MANUFACTURE THEREOF

FIELD OF THE INVENTION

The present invention is, in general, directed to a semiconductor device and a method of manufacture thereof. More particularly, the present invention relates to a semiconductor device having a heavy atom p-type implant and a method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits. Thus, such circuits realize improved performance and lower costs as the performance of the MOS transistor is increased and as the manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by heavily doping the regions with a dopant material of a desired conductivity. The conductivity of the doped region depends on the type of impurity used to dope the region. The typical MOS transistor is symmetrical, which means that the source and drain are interchangeable. Whether a region acts as a source or drain typically depends on the respective applied voltages and the type of device being made. The collective term source/drain region is used herein to generally describe an active region used for the formation of either a source or drain.

A channel region is formed in the semiconductor substrate beneath the gate electrode and between the source and drain regions. The channel is typically lightly doped with a dopant material having a conductivity type opposite to that of the source and drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to controls the current flow through the channel region. This type of device is commonly referred to as a MOS field-effect-transistor (MOSFET).

MOS devices typically fall in one of two groups depending the type of dopant materials used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

Historically, only one type of device would be fabricated on a single wafer (i.e., only a single technology such as NMOS or PMOS would be used). As larger numbers of devices were formed on a wafer, increases in power density and dissipation inhibited the ability to use only a single technology. In response, complementary MOS (CMOS) technology was developed using both PMOS and NMOS transistors fabricated in a single substrate. While use of CMOS technology solves a number of problems, the technology is significantly more complex with respect to device physics. Moreover, since different types of dopant materials are being used, the complexity and cost of the fabrication process are both increased. For example, different masking and implantation steps are typically required to form doped regions for each type of dopant material in the substrate.

A number of different techniques and fabrication processes may be used to form CMOS devices. With reference to FIGS. 1A–1E, one typical CMOS fabrication process will be described. The process depicted is used to form semiconductor structures having lightly doped drain (LDD) regions within the source and drain structures. As is well known, LDD structures are used in the formation of semiconductor devices having short channels in order to overcome problems associated therewith.

As depicted in FIG. 1A, a substrate 101 is divided into two device regions 101A and 101B. The two device regions 101A and 101B are of different conductivity types (n-channel and p-channel, respectively, in the illustrated embodiment) and are used to form the CMOS structures thereon. Different techniques may be used to form the two device regions 101A and 101B. The regions may be formed using an n-well in a p-type substrate, a p-well in an n-type substrate, twin wells in either an n- or p-type of substrate, etc. On the surface of the substrate 101, a field oxide, such as $SiO_2$, is generally provided to isolate the surface of the two device regions 101A and 101B. One or more gate electrodes 103 are formed on each of the device regions 101A and 101B. In the illustrated example, one gate electrode 103A is formed on the device region 101A and one gate electrode 103B is formed on the device region 101B.

An LDD region in the n-channel device region is first formed by masking the p-channel device region 101B with a mask layer 105 and implanting a relatively low dose of an n-type dopant material 107 into the exposed areas to form lightly doped (i.e., LDD) n-type regions 109 as illustrated in FIG. 1A. A second mask 111 is formed over the n-channel device region 101A and a p-type dopant material 113 is implanted into the p-channel device region 101B to form lightly doped (i.e., LDD) p-type regions 115 in the substrate adjacent the gate electrode 103B.

Following the LDD implants, a spacer layer is formed and etched to form spacers 117 on sidewalls of the gate electrodes 103A and 103B. The p-channel device region 101B is again masked with a mask layer 119 and a heavy dose of an n-type dopant material 121 is implanted into the substrate aligned with the spacers 117A to form heavily doped n-type regions 118A, as illustrated in FIG. 1C. In this manner, LDD structures 123A are formed in the substrate as illustrated in FIG. 1C.

In a manner similar to the n-channel region, the p-channel device region 101B is then exposed while masking the n-channel device region 101A with a mask layer 125. A high dose of a p-type dopant material 118 is implanted into the substrate using spacers 117B for alignment to form heavily doped p-type regions 118B. In this manner, LDD structures 127B are also formed in the p-channel device region 101B.

Following formation of the LDD structures, the mask 125 is typically removed and further processing such as silicidation and interconnect formation is performed. The resulting structure is depicted in FIG. 1E. A more detailed description of the elements and fabrication of LDD source/drain regions may be found in S. Wolf, *Silicon Processing for the VLSI Era,* Vol. 2: Processing Integration, pp. 354–363.

As noted above, the use of different types of dopant materials significantly increases the complexity of CMOS technology. For example, p-type dopant materials, such as boron, typically diffuse more rapidly in silicon than n-type dopant materials, such as arsenic. This places constraints on the heat treatment of the device and reduces the ability to control the profiles of source/drain regions.

The formation of LDD regions in CMOS devices further increases the complexity of fabricating CMOS devices. For example, the heavily doped n-type and p-type regions 118A and 118B must have adequate conductivity for device performance and sufficient depth to allow the formation of a silicide layer. Using the above conventional techniques to provide adequate conductivity and depth can cause excessive lateral diffusion of the heavily-doped n-type and p-type regions. This excessive lateral diffusion can in some instances overlap the lightly-doped n-type and p-type regions 109 and 115 and reduce the effective channel length.

SUMMARY OF THE INVENTION

Generally, the present invention relates to semiconductor devices having a PMOS active region with a shallow heavy atom p-type implant. One embodiment is a PMOS device which includes a substrate, at least one gate electrode disposed on the substrate, and first and second doped active regions disposed adjacent to the gate electrode. The first active region having a higher concentration of a p-type heavy atom dopant material than the second active region.

Another embodiment is a CMOS device which includes at least one NMOS transistor and at least one PMOS transistor disposed on a substrate. The PMOS transistor has a gate electrode and first and second doped active regions disposed adjacent to the gate electrode. The first doped active region has a higher concentration of a p-type heavy atom dopant material than the second doped active region.

A further embodiment is a method for forming a PMOS device. A gate electrode is formed over a device region of a substrate. Spacers are then formed on sidewalls of the gate electrode. A first p-type dopant material is selectively implanted into active regions adjacent to the gate electrode using the spacers as a mask. Then a portion of one of the spacers is removed to form a thinner spacer and a second p-type dopant material is selectively implanted into a first one of the active regions using the thinner spacer as a mask. The second p-type dopant material is a heavy atom species.

Yet another embodiment is a method for forming a CMOS device. At least one NMOS gate electrode is formed over a NMOS device region of a substrate and at least one PMOS gate electrode is formed over a PMOS device region of a substrate. Spacers are formed on sidewalls of the NMOS gate electrode and the PMOS gate electrode. A first n-type dopant material is selectively implanted into NMOS active regions adjacent to the NMOS gate electrode using the spacers on the NMOS gate electrode as a mask. A first p-type dopant material is selectively implanted into PMOS active regions adjacent to the PMOS gate electrode using the spacers on the PMOS gate electrode as a mask. Then a portion of one of the spacers on the PMOS gate electrode is removed to form a thinner spacer and a second p-type dopant material is selectively implanted into one of the PMOS active regions using the thinner spacer as a mask. The second p-type dopant material is a heavy atom species.

The above summary of the present invention is not intended to describe each disclosed embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
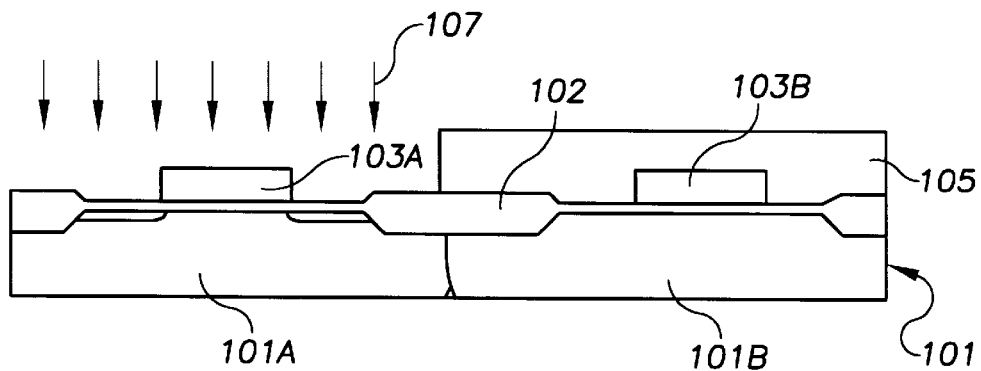
FIGS. 1A through 1E illustrate a conventional process for forming a CMOS semiconductor device.
Figure 1B:
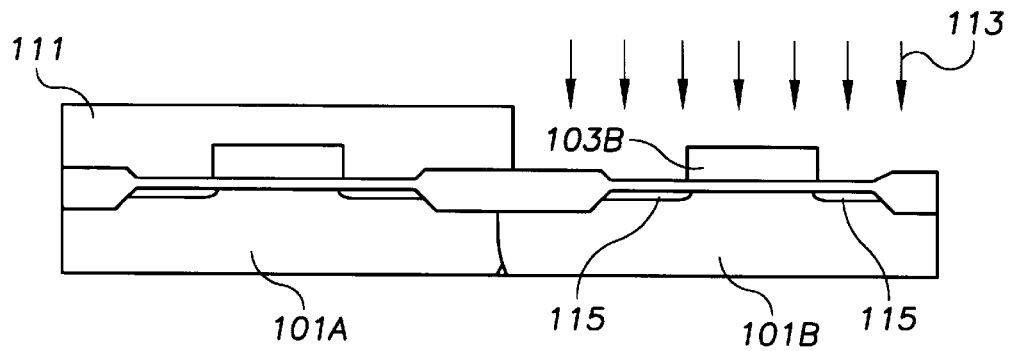
Figure 1C:
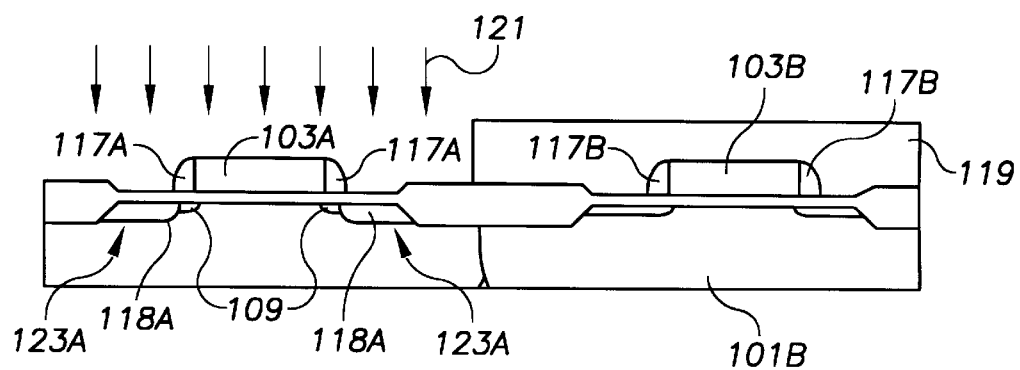
Figure 1D:
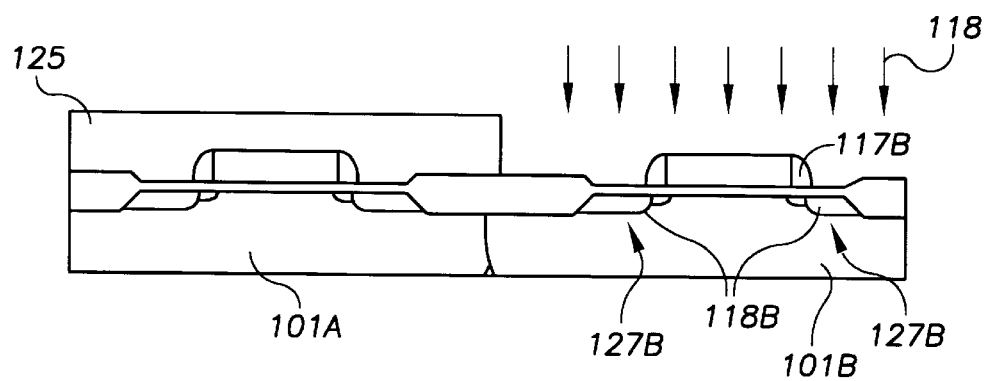
Figure 1E:
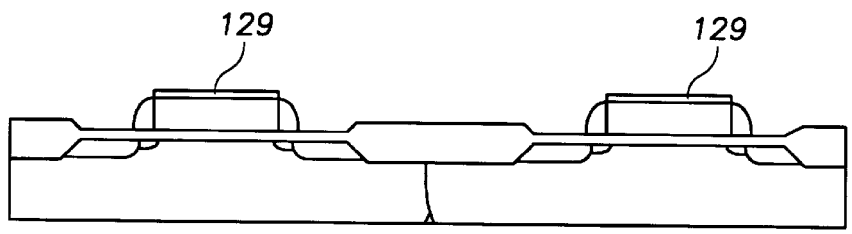

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices, including in particular, PMOS, CMOS, and BiCMOS structures. While the present invention is not so limited, an appreciation of various aspects of the invention will be gained through a discussion of the fabrication processes for and characteristics of such a device in connection with the examples provided below. In particular, the present invention is illustrated and described using an exemplary fabrication process for a CMOS device. It will, however, be appreciated that the invention also includes other semiconductor devices including PMOS and BiCMOS devices.

Figure 2A:
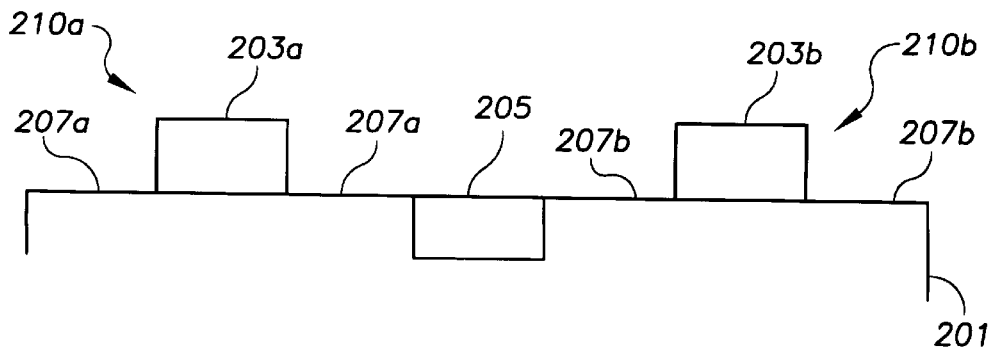
FIGS. 2A through 2F illustrate an exemplary fabrication process for forming a CMOS device in accordance with one embodiment of the invention.

FIGS. 2A through 2F illustrate a process for fabricating a CMOS device in accordance with one embodiment of the present invention. Using known techniques, NMOS device regions and PMOS device regions are defined and gate electrodes are formed on a substrate 201 (only one gate electrode for each type of device region is shown), as illustrated in FIG. 2A. The NMOS device region 210a and PMOS device region 210b are typically separated by a field region 205. The gate electrode 203a in the NMOS device region 210a and the gate electrode 203b in the PMOS device region 210b are each typically insulated from the substrate 201 by a thin oxide layer (not shown). The resultant structure is illustrated in FIG. 2A. It will be appreciated that a number of different known fabrication techniques can be used to obtain the gate electrode structures depicted in FIG. 2A.

Portions of the semiconductor substrate 201 which lie adjacent to the gate electrodes 203a and 203b generally define the active regions 207a and 207b of the substrate 201. As used herein, the term active region encompasses a region where an active portion of the device resides whether the active portion has been or will be formed. The active regions 207a and 207b may serve, for example, as source or drain regions of a semiconductor device.

The term device region as used herein refers to a region of the substrate associated with a MOS device having a particular type of channel. The channel type, n-type or p-type, of a channel is identified based on the conductivity type of the channel developed under the transverse electric field. This means that an NMOS device region, for example, includes an n-type channel under a transverse electric field and is associated with n-type doped active regions and gate electrodes.

Figure 2B:
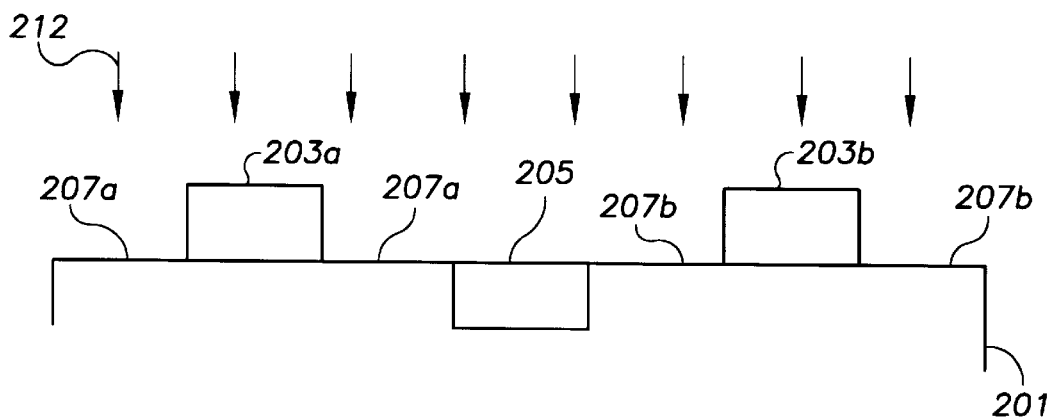

Following the formation of the gate electrodes 203a and 203b, the NMOS and PMOS active regions 207a, 207b are implanted with an amorphizing implant material 212, as shown in FIG. 2B, to create disorder in the crystal lattice structure of the substrate 201. This implantation generates amorphized portions of the NMOS and PMOS active regions 207a, 207b. The amorphization of the crystal structure typically reduces the diffusion of subsequent or prior implanted n-type or p-type dopant material (e.g., n-type dopant material 218 and p-type dopant materials 222, 224 as shown in FIGS. 2D, 2E, and 2F) as the amorphization reduces the number of free paths through which the implanted dopant material may move.

Figure 2C:
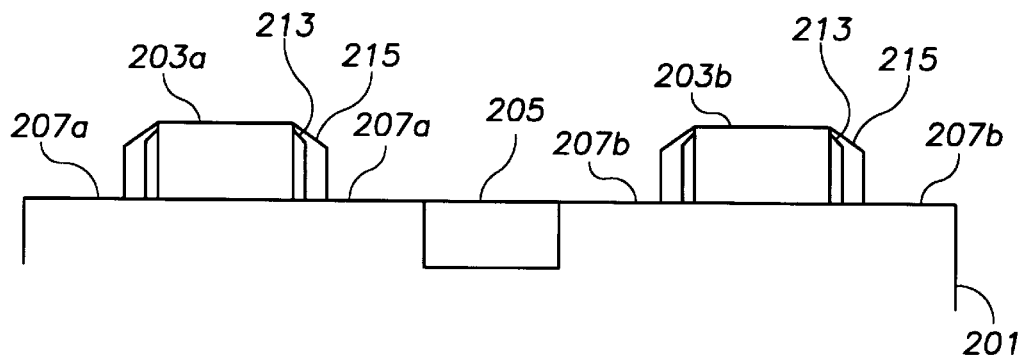
Figure 2D:
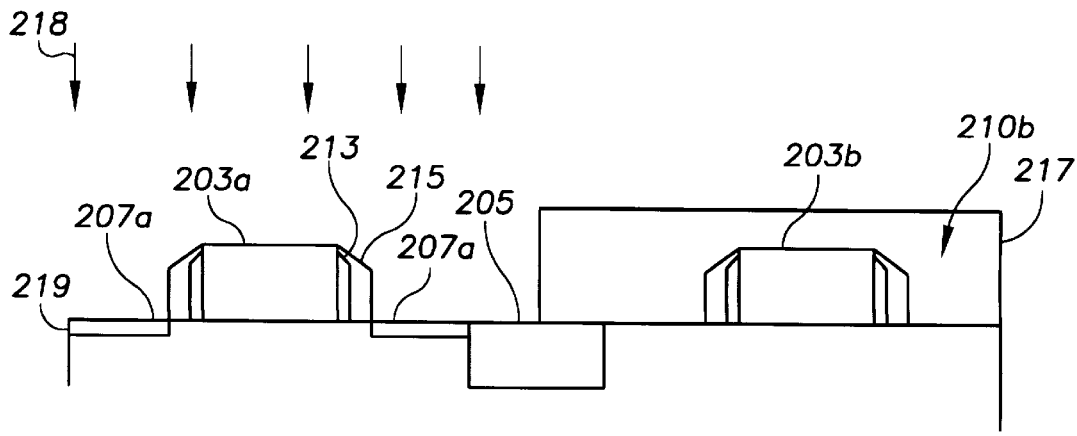
Figure 2E:
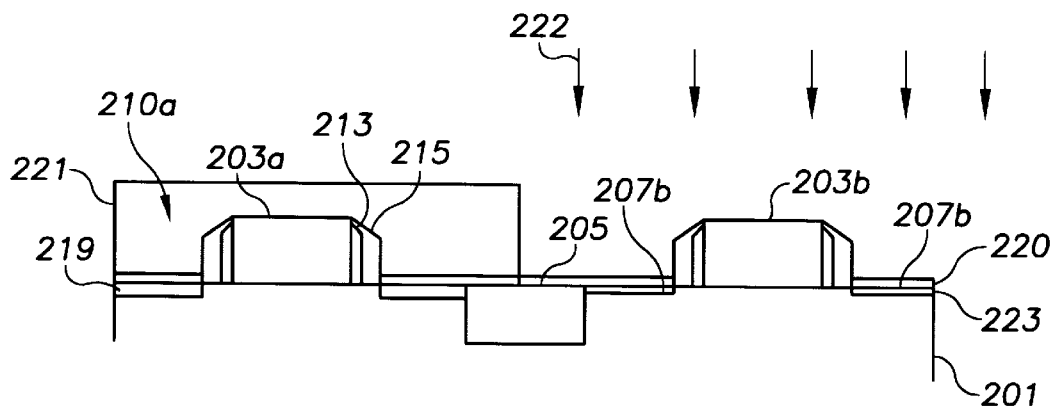
Figure 2F:
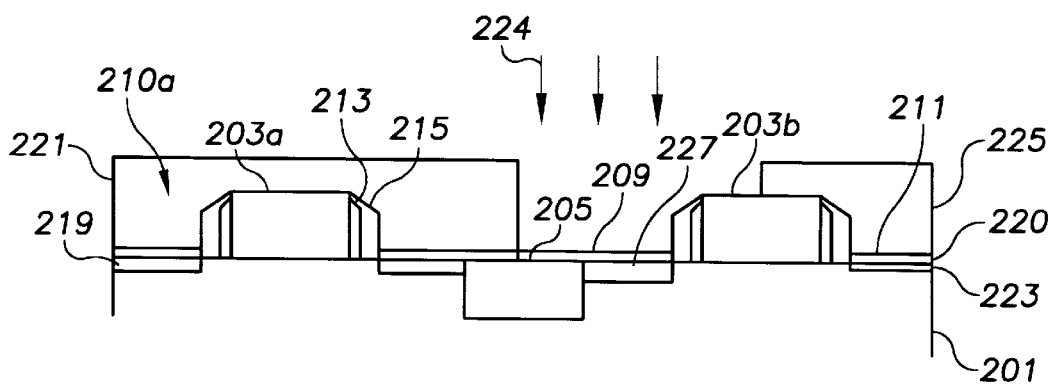

This amorphization process facilitates the formation of shallow n-type and p-type doping regions (e.g., n-type doped regions 219 and p-type doped regions 223 and 227 as shown in FIGS. 2D, 2E, and 2F) by a n-type or p-type dopant implant. The amorphization process may be performed before or after the n-type or p-type dopant material has been implanted. However, the amorphization should occur prior to an anneal (e.g., heating) step, otherwise the n-type or p-type dopant material will have already significantly diffused within the NMOS and PMOS active regions 207a, 207b.

The amorphizing implant material 212 may, for example, be carbon, $N_2$, silicon, or combinations thereof. $N_2$ may further confine the n-type or p-type dopant material near the surface of the substrate 201. When implanting $N_2$, the implant peak is typically selected to be below the surface of the source/drain region. Furthermore, it has been found that an implant of carbon, either by itself or in combination with other amorphizing dopant material, enhances device properties. For many applications, suitable implant energies and dosages of an amorphizing implant material 212, such as carbon, silicon, or $N_2$, range from about 2 to 30 keV and 5E13 ($5 \times 10^{13}$) to 7E14 ($7 \times 10^{14}$) dopant atoms/cm², respectively.

One or more sets of spacers 213, 215 (in the illustrated embodiment, there are two sets of spacers) are formed on the sidewalls of the gate electrodes 203a and 203b, as shown in FIG. 2C. The spacers 213, 215 may be formed using any of a number of known techniques. For example, conventional deposition (e.g., conformal chemical vapor deposition (CVD)) and etching techniques may be used to form the spacers 213, 215. The spacers 213, 215 are used to space subsequent p-type and n-type dopant material implants from the gate electrodes 203a and 203b, as will be discussed below.

In some embodiments, first spacers 213 and second spacers 215 are formed one over the other to, for example, facilitate implantation of dopant material at different positions in the active regions 207a, 207b, as will be described below, particularly in connection with FIG. 2F. In these embodiments, each of the spacers may be formed separately and etched separately. Alternatively, both sets of spacers 213, 215 may be formed and then etched simultaneously or sequentially. In some cases, the spacers 213, 215 may be sufficiently thin that there is no need for etching.

The material used in the first spacers 213 is often different than the material used in the second spacers 215. For example, one set of spacers (for example, the first spacers 213) may be made of an oxide material, such as silicon dioxide, and the other set spacers (for example, the second spacers 215) may be made of a nitride material, such as silicon nitride or silicon oxynitride. This facilitates selective removal of one set of spacers, leaving the other set.

The lateral width of the spacers 213, 215 may be selected in consideration of the desired spacing of the implants. Suitable lateral widths of the first spacers 213 range, for example, from 50 to 100 angstroms for many applications. Suitable lateral widths of the second spacers 215 range, for example, from 50 to 250 angstroms for many applications. However, larger or smaller spacers 213, 215 may be used.

After the spacers 213, 215 are formed, a first mask 217 is formed to expose portions of the NMOS active regions 207a and typically cover the PMOS device region 210b. This may be done, for example, by depositing, developing, and selectively removing a photoresist.

A n-type dopant material 218 is then implanted into the substrate 201 to form n-doped regions 219 in the NMOS active regions 207a, as shown in FIG. 2D. Suitable n-type dopant material includes arsenic (As) and phosphorus (P), for example. The implant energies and dosages of this implant are typically selected to provide a desired depth and resistivity of the n-doped regions 219, while taking into consideration lateral diffusion of the n-type dopant material 218 in the NMOS active regions 207a. For many applications, suitable implant energies and dosages of the n-type dopant material 218 range from about 5 to 60 keV and 2E15 ($2 \times 10^{15}$) to 4E15 ($4 \times 10^{15}$) dopant atoms/cm², respectively.

The first mask 217 is removed and the partially fabricated CMOS device is often annealed using, for example, rapid thermal anneal (RTA) techniques. This activates the n-type dopant material in the n-doped regions 219, and also drives the n-type dopant material deeper into the substrate 201 and provides a more uniform distribution of the n-type dopant material within the n-doped regions 219. This may also cause some lateral diffusion of the n-type dopant material. This diffusion, however, may be limited due to the amorphization of the NMOS active regions 207a by the amorphizing implant material 212. The temperature to which the substrate 201 is heated typically ranges, for example, from 950 to 1100° C. for periods of time ranging from, for example, 30 to 60 seconds.

This annealing process may also form a thin oxide layer 220 over the substrate 201, as depicted in FIG. 2E. This oxide layer may have a thickness which ranges, for example, from 20 to 100 angstroms.

A second mask 221 is formed to expose portions of the PMOS active regions 207b and typically cover the NMOS device region 210a, as illustrated in FIG. 2E. This may be done, for example, by depositing, developing, and selectively removing a photoresist using conventional techniques.

The exposed portions of the PMOS active regions 207b are implanted with a first p-type dopant material 222 to form first p-type doped regions 223 in the PMOS active regions 207b, as illustrated in FIG. 2E. Suitable first p-type dopant materials 222 include, for example, boron and boron compounds, such as boron hydride and boron halides. Other suitable first p-type dopant materials include, for example, indium, and gallium species.

The implant parameters are selected in consideration of the desired profile of the first p-type dopant regions 223. For many applications, suitable implant energies and dosages of the first p-type dopant material 222 range from about 2 to 30 keV and 8E14 ($8\times10^{14}$) to 2E15 ($2\times10^{15}$) dopant atoms/cm$^2$, respectively.

A third mask 225 is formed to expose one PMOS active region 209 and typically cover the other PMOS active region 211, as illustrated in FIG. 2F. This may be done, for example, by depositing, developing, and selectively removing a photoresist using conventional techniques. In some embodiments, the exposed PMOS active region 209 is a source region and the covered PMOS active region 211 is a drain region.

Often the second mask 221 remains formed over the NMOS device region 210a. However, if the second mask 221 has been removed then the third mask 225 is formed to cover the NMOS device region 210a, as well.

The second spacer 215 is removed from the same side of the PMOS gate electrode 203b as the exposed PMOS active region 211. This serves to expose an additional portion of the PMOS active region 209. The second spacer 215 may be removed by well-known techniques, including, for example, selective etching of the second spacer 215, leaving the first spacer 213.

The exposed portions of the PMOS active region 209 are implanted with a second p-type dopant material 224 to form second p-type doped region 227 in the exposed PMOS active region 209, as illustrated in FIG. 2F. The second p-type doped region 227 typically overlaps and, because of its much higher dopant dosage, overwhelms the first p-type doped region 223 in the exposed PMOS active region 209.

The second p-type dopant material 224 is typically a heavy atom species. Suitable second p-type dopant materials 224 are, for example, indium and gallium species. These species may include, besides the atoms themselves, for example, hydride and halide compounds of these atoms.

The implant parameters are selected in consideration of the desired profile of the second p-type dopant region 227 taking into consideration subsequent diffusion of the second p-type dopant material within the PMOS active region 207b. Typically, the dopant dosages and implant energies are chosen so that the second p-type dopant region 227 has a higher concentration of dopant atoms than the first p-type dopant region 223. For many applications, suitable implant energies and dosages of a second p-type dopant material 224 range from about 1 to 20 keV and 3E15 ($3\times10^{15}$) to 8E15 ($8\times10^{15}$) dopant atoms/cm$^2$, respectively.

The second mask 221 and the third mask 225 are removed and the substrate 201 is typically annealed using, for example, an RTA process, to activate the p-type dopant material 222, 224 in the p-doped regions 223, 227. One exemplary anneal process includes an RTA treatment at, for example, 750 to 900° C. for, for example, 30 to 60 seconds.

Processing may subsequently continue with well-known fabrication steps, such as silicidation and contact formation, to complete the device structure. Depending on the type of silicidation used, an additional spacer may be formed.

A number of modifications to the exemplary fabrication process illustrated in FIGS. 2A through 2F may be made. In one embodiment of the fabrication process, the amorphization of the NMOS and PMOS device regions 210a, 210b, as shown in FIG. 2B, is omitted. In another embodiment, a second amorphization implant into the PMOS device region 210b is performed prior to the implantation of the second p-type dopant material 224 and, optionally, prior to the formation of the third mask 225. In yet another embodiment, the amorphization process of FIG. 2B is omitted and an amorphization of the PMOS device region 210b is performed prior to implantation of the second p-type dopant material 224 and, optionally, prior to implantation of the first p-type dopant material 222. Another option in this particular embodiment is to also amorphize the NMOS device region 210a after the first mask 217 has been formed, but prior to the implantation of the n-type dopant material 218. These modifications may also be implemented in the fabrication processes described below in connection with FIGS. 3A–3F and FIGS. 4A–4F.

In another embodiment of the fabrication process, a first spacer is formed over the gate electrodes 203a, 203b and is followed by implantation of the n-type dopant material 218 and the first p-type dopant material 222 using the first spacer as a mask. The first spacer has a thickness of, for example, 100 to 300 angstroms. The first spacer is then taken off at least one side of the PMOS gate electrode 203b and a second spacer formed on that side of the PMOS gate electrode 203b to expose an additional portion of the PMOS active region 209. This second spacer may have a thickness of, for example, 50 to 100 angstroms. The second p-type dopant material 224 is then implanted using the second spacer as a mask. This modification may also be implemented in the fabrication processes described below in connection with FIGS. 3A–3F and FIGS. 4A–4G.

Another alternative to the process illustrated in FIGS. 2A–2F includes the formation of a single spacer, rather than the first and second spacers 213, 215. The n-type dopant material 218 and the p-type dopant material 222 are implanted using this single spacer as a mask. A third mask 225 is then formed over one of the PMOS active regions 211 and then a portion of the spacer which covers a part of the PMOS active region 209 on the other side of the PMOS gate electrode 203b is removed to form a thinner spacer. This can be accomplished by well-known techniques, including, for example, a timed etch. The second p-type dopant material 224 is then implanted using the thinner spacer as a mask.

Figure 3A:
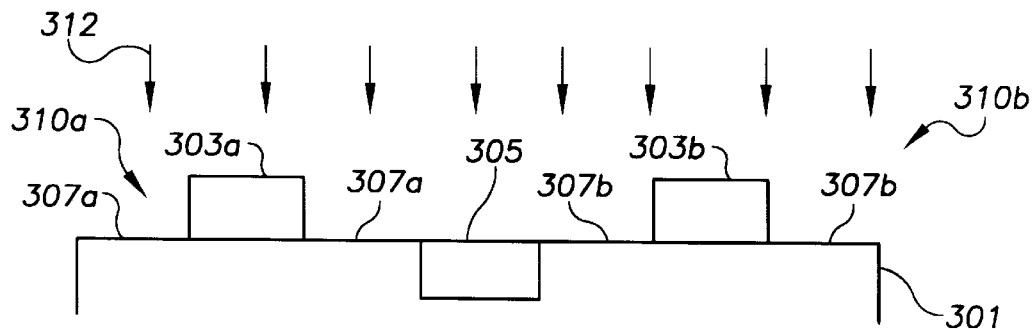
FIGS. 3A through 3F illustrate an exemplary fabrication process for forming a CMOS device in accordance with another embodiment of the invention.

FIGS. 3A through 3F illustrate a process for fabricating a CMOS device using two n-type doping steps. Using known techniques, NMOS device regions and PMOS device regions are defined and gate electrodes are formed on a substrate 301 (only one gate electrode for each type of device region is shown), as illustrated in FIG. 3A. The NMOS device region 310a and PMOS device region 310b are typically separated by a field region 305. The gate electrode 303a in the NMOS device region 310a and the gate electrode 303b in the PMOS device region 310b are each typically insulated from the substrate 301 by a thin oxide layer (not shown). Portions of the semiconductor substrate 301 which lie adjacent to the gate electrodes 303a and 303b generally define the active regions 307a and 307b of the substrate 301. It will be appreciated that a number of different known fabrication techniques can be used to obtain the gate electrode structures depicted in FIG. 3A.

Following the formation of the gate electrodes 303a and 303b, the NMOS and PMOS active regions 307a, 307b are implanted with an amorphizing dopant material 312, as shown in FIG. 3A, to create disorder in the crystal lattice structure of the substrate 301. This implantation generates amorphized portions of the NMOS and PMOS active regions 307a, 307b. The conditions and materials for this amorphization implant are the same as for the embodiment illustrated in FIGS. 2A through 2F.

Figure 3B:
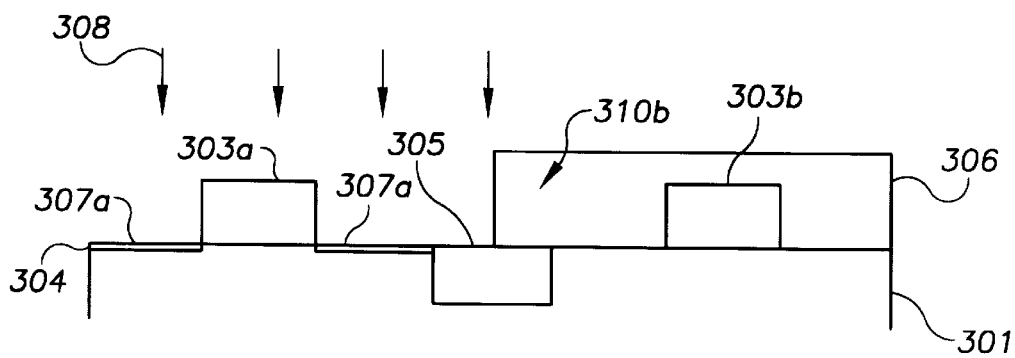

Following the amorphization of the NMOS and PMOS active regions 307a, 307b, a first mask 306 is formed to expose portions of the NMOS active regions 307a and typically cover the PMOS device region 310b of the substrate 301. A first n-type dopant material 308 is implanted into the substrate 301 to form first n-doped regions 304 in the NMOS active regions 307a, as shown in FIG. 3B. Suitable first n-type dopant material 308 includes arsenic and phosphorus, for example.

The first n-doped regions 304 are typically shallow, lightly-doped regions used to improve the hot carrier injection resistance of the device. The first n-doped regions 304 also often define the effective channel length of the device. The implant energies and dosages of this implant are typically selected to provide the desired depth and resistivity of the n-doped regions 304. For many applications, suitable implant energies and dosages of the first n-type dopant material 308 range from about 2 to 30 keV and 5E13 ($5 \times 10^{13}$) to 7E14 ($7 \times 10^{14}$) dopant atoms/cm$^2$, respectively. Once the implant of the first n-type dopant material 308 is completed, the first mask 306 is typically removed.

Figure 3C:
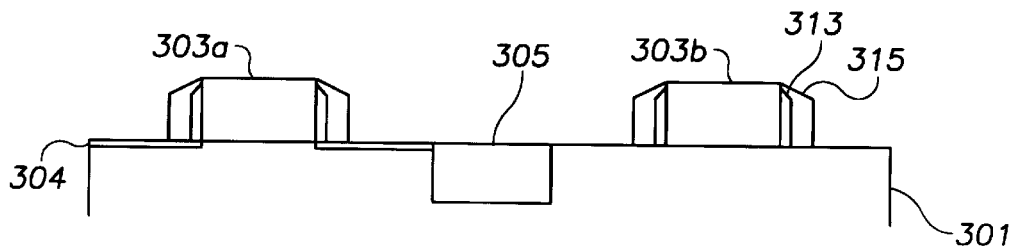
Figure 3D:
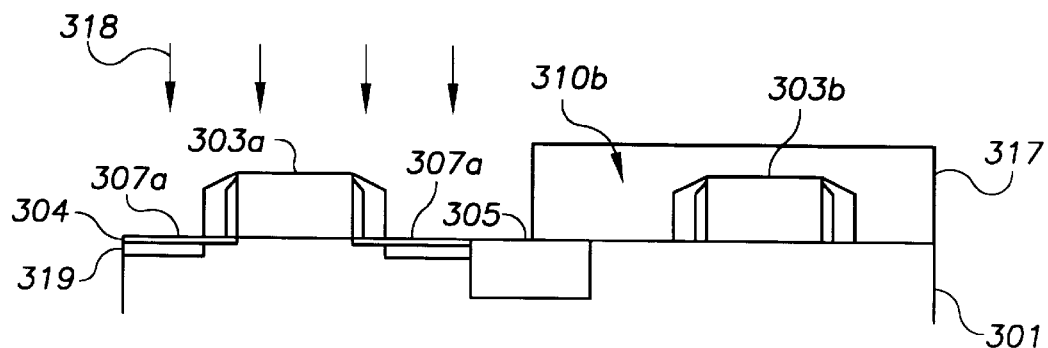

The process then continues as described above with respect to FIGS. 2C through 2F. The same techniques and materials are used unless otherwise indicated. One or more spacers 313, 315 are formed on the sidewalls of the gate electrodes 303a and 303b, as shown in FIG. 3C. A second mask 317 is formed to expose portions of the NMOS active regions 307a and typically cover the PMOS device region 310b of the substrate 301. A second n-type dopant material 318 is implanted into the substrate 301 to form second n-doped regions 319 in the NMOS active regions 307a, as shown in FIG. 3D.

The second mask 317 is removed and the partially fabricated CMOS device is typically annealed. This annealing process may form a thin oxide layer 320 over the substrate 301, as depicted in FIG. 3E.

Figure 3E:
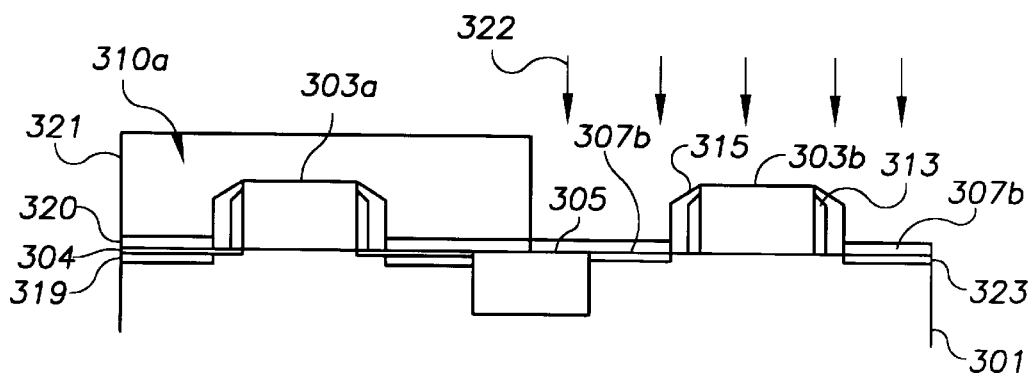

A third mask 321 is formed to expose portions of the PMOS active regions 307b and typically cover the NMOS device region 310a of the substrate 301, as illustrated in FIG. 3E. The exposed portions of the PMOS active regions 307b are implanted with a first p-type dopant material 322 to form first p-type doped regions 323 in the PMOS active regions 307b, as illustrated in FIG. 3E.

Figure 3F:
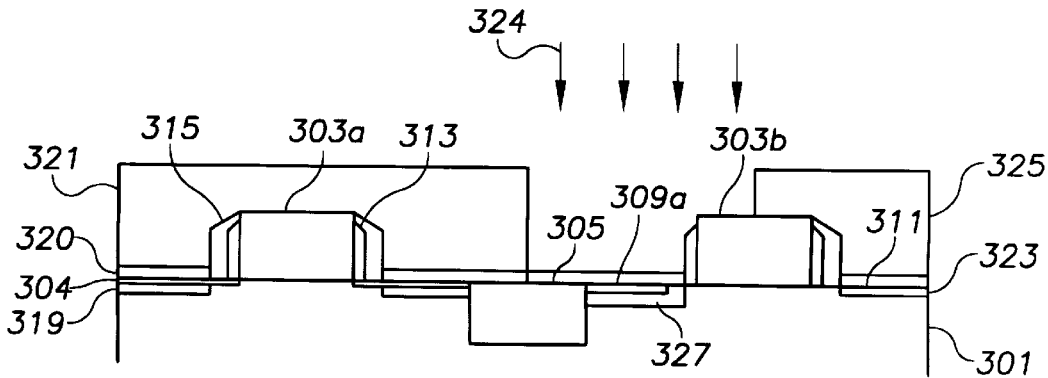

A fourth mask 325 is formed to expose portions of one PMOS active region 309 and typically cover the other PMOS active region 311, as illustrated in FIG. 3F. The second spacer 315 is removed from the side of the PMOS gate electrode 303b adjacent to the exposed PMOS active region 309. This serves to expose an additional portion of the PMOS active region 309. The exposed portions of the PMOS active region 309 are implanted with a second p-type dopant material 324 to form a second p-type doped region 327 in the exposed PMOS active region 309, as illustrated in FIG. 3F. The second p-type doped region 327 typically overlaps and, because of its much higher dopant dosage, overwhelms the first p-type doped region 323 in the exposed PMOS active region 309. The second p-type dopant material 324 is typically a heavy atom species.

The fourth mask 319 is removed and the substrate 301 is typically annealed. Processing may subsequently continue with well-known fabrication steps, such as silicidation and contact formation, to complete the device structure. Depending on the type of silicidation used, an additional spacer may be formed.

Figure 4A:
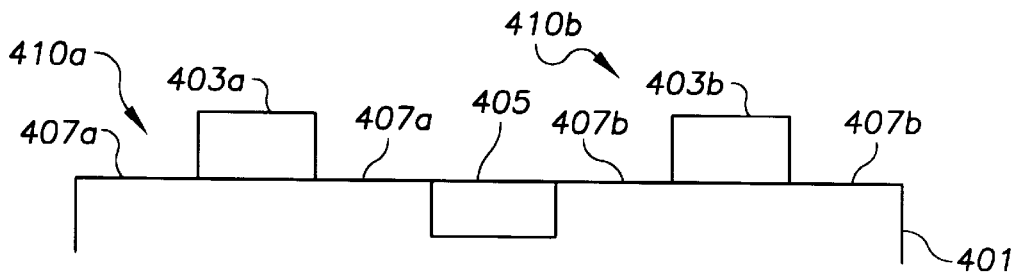
FIGS. 4A through 4G illustrate an exemplary fabrication process for forming a CMOS device in accordance with a third embodiment of the invention.

FIGS. 4A through 4G illustrate another exemplary process for fabricating a CMOS device using three p-type dopant implants. The techniques and materials described in connection with the embodiment illustrated in FIGS. 2A through 2F are used, unless otherwise indicated. Using known techniques, NMOS device regions and PMOS device regions are defined and gate electrodes are formed on a substrate 401 (only one gate electrode for each type of device region is shown), as illustrated in FIG. 4A. The NMOS device region 410a and PMOS device region 410b are typically separated by a field region 405. The gate electrode 403a in the NMOS device region 410a and the gate electrode 403b in the PMOS device region 410b are each typically insulated from the substrate 401 by a thin oxide layer (not shown). Portions of the semiconductor substrate 401 which lie adjacent the gate electrodes 403a and 403b generally define the active regions 407a and 407b of the substrate 401.

Figure 4B:
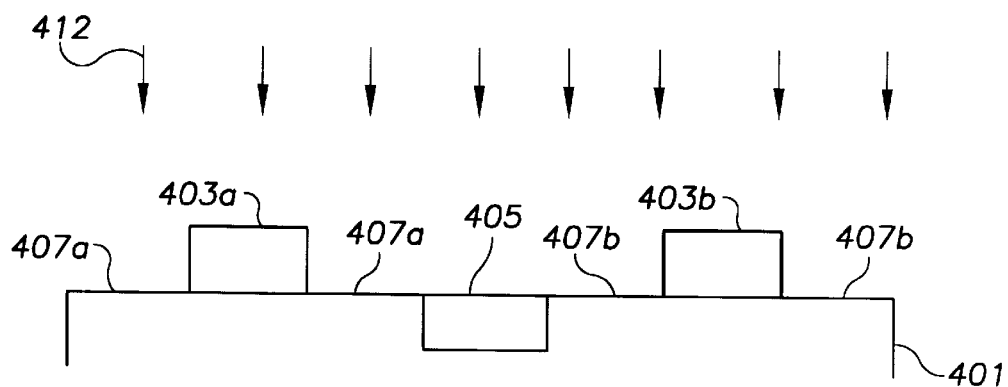
Figure 4C:
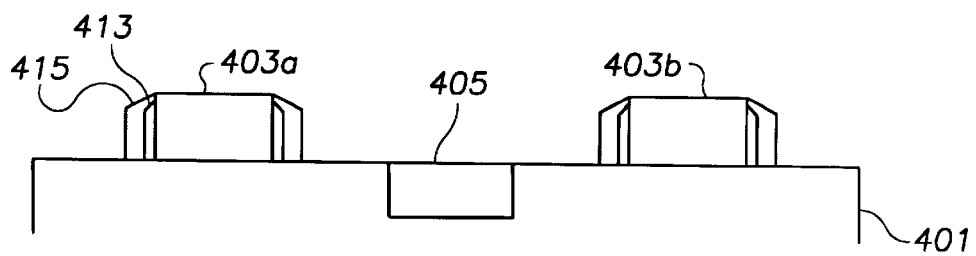
Figure 4D:
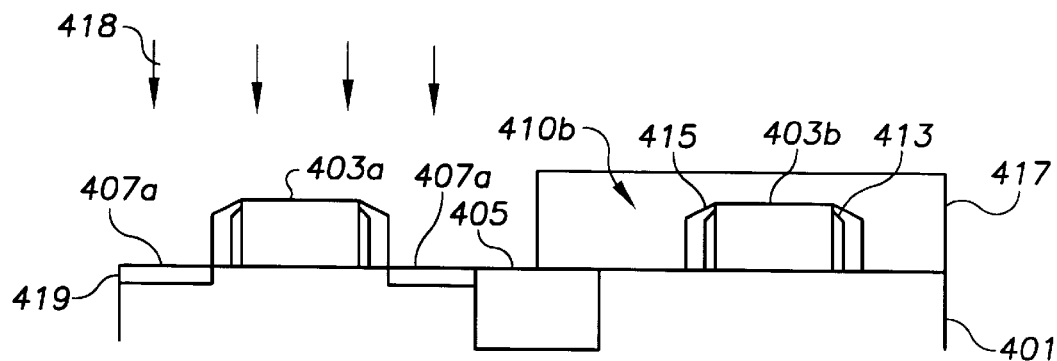

Following the formation of the gate electrodes 403a and 403b, the NMOS and PMOS active regions 407b are implanted with an amorphizing implant material 412, as shown in FIG. 4B, to create disorder in the crystal lattice structure of the substrate 401. This implantation generates amorphized portions of the NMOS and PMOS active regions 407a, 407b. Next, one or more spacers 413, 415 are formed on the sidewalls of the gate electrodes 403a and 403b, as shown in FIG. 4C. A first mask 417 is then formed to expose portions of the NMOS active regions 407a and typically cover the PMOS device region 410b of the substrate 401, as shown in FIG. 4D. A n-type dopant material 418 is implanted into the substrate 401 to form n-doped regions 419 in the NMOS active regions 407a.

Figure 4E:
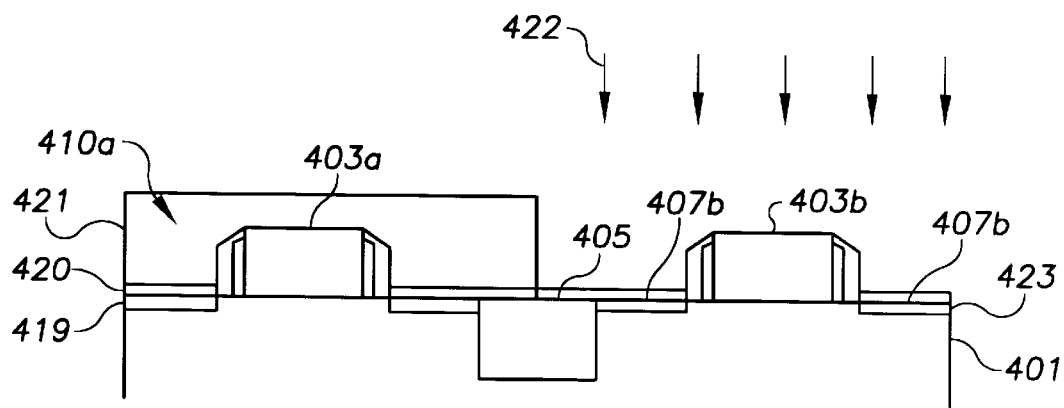

The first mask 417 is removed and the partially fabricated CMOS device is typically annealed. This annealing process may form a thin oxide layer 420 over the substrate 401, as depicted in FIG. 4E.

A second mask 421 is then formed to expose portions of the PMOS active regions 407b and cover the NMOS device region 410a of the substrate 401. The exposed portions of the PMOS active regions 407b are implanted with a first p-type dopant material 422 to form first p-type doped regions 423 in the PMOS active regions 407b, as illustrated in FIG. 4E. Suitable first p-type dopant materials 422 are, for example, boron, aluminum, indium, and gallium species.

The first p-type doped regions 423 of this embodiment are typically shallow, lightly-doped regions. The implant parameters are selected in consideration of the desired profile of the first p-type dopant regions 423. These implant parameters often differ from those described in the previous embodiments. For many applications, suitable implant energies and dosages of a first p-type dopant material 422 range from about 2 to 30 keV and 5E13 ($5 \times 10^{13}$) to 7E14 ($7 \times 10^{14}$) dopant atoms/cm$^2$, respectively.

Figure 4F:
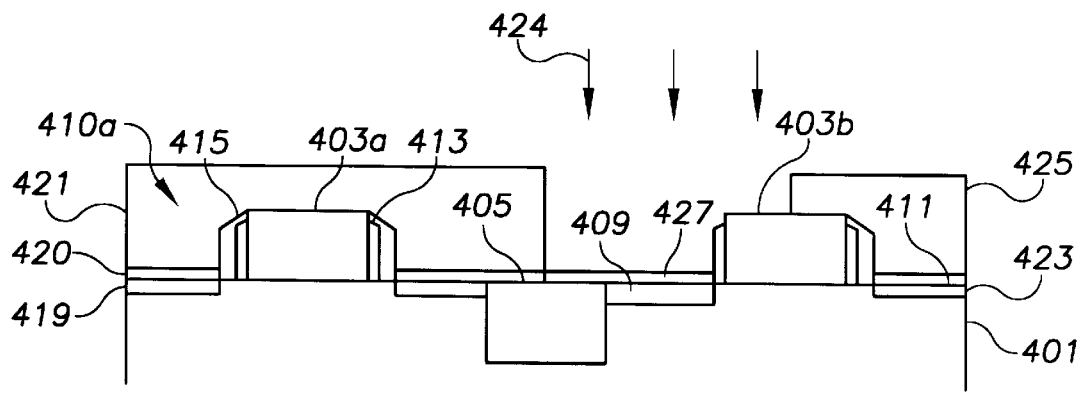

A third mask 425 is formed to expose portions of one PMOS active region 409 and typically cover the other PMOS active region 411, as illustrated in FIG. 4F. Often the second mask 421 remains formed over the NMOS device region 410a. However, if the second mask 421 has been removed than the third mask 425 is formed over the NMOS device region 410a, as well.

The second spacer 415 is removed from at least the side of the PMOS gate electrode 403b adjacent to the exposed PMOS active region 409. This serves to expose an additional portion of the PMOS active region 409. The exposed portions of the PMOS active region 409 are implanted with a second p-type dopant material 424 to form a second p-type doped region 427 in the exposed PMOS active region 409, as illustrated in FIG. 4F. The second p-type doped region 427 typically overlaps and, because of its much higher dopant dosage, overwhelms the first p-type doped region 423 in the exposed PMOS active region 409.

The second p-type dopant material 424 is typically a heavy atom species. Suitable second p-type dopant materials 424 are, for example, indium and gallium species.

The implant parameters are selected in consideration of the desired profile of the second p-type dopant region 427. Typically, the dopant dosages and implant energies are chosen so that the second p-type dopant region 427 is deeper and has a higher concentration of dopant atoms than the first p-type dopant region 423. For many applications, suitable implant energies and dosages of a second p-type dopant material 424 range from about 1 to 20 keV and 3E15 ($3 \times 10^{15}$) to 8E15 ($8 \times 10^{15}$) dopant atoms/cm$^2$, respectively.

The third mask 425, the spacers 413, 415, and, optionally, the second mask 421 are removed using well-known techniques. These spacers 413, 415 are replaced by third spacers 430, using well-known spacer formation processes. One alternative includes, for example, leaving the second mask 421 and removing the third mask 425 and spacers 413, 415 around the PMOS gate electrode 403b and then depositing the third spacers 430 only around the PMOS gate electrode 403b. Another alternative is to remove only the spacer 413 on the side of the PMOS gate electrode 403b adjacent to the PMOS active region 409, then to form a third spacer 430 on that particular side of the gate electrode 403b, and finally to remove the third mask 425.

Figure 4G:
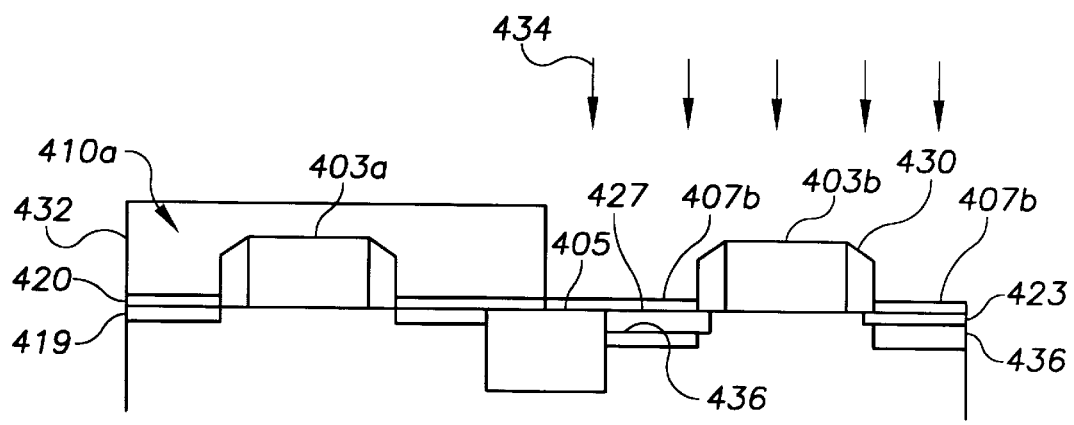

Returning again to FIGS. 4A through 4G, after the third spacer 430 is formed, a fourth mask 432 is then formed (unless the second mask 421 has not been removed) to expose the PMOS active regions 407b and cover the NMOS device region 410a, as depicted in FIG. 4G. The exposed portions of the PMOS active regions 407b are implanted with a third p-type dopant material 434 to form third p-type doped regions 436 in the PMOS active regions 407a, as illustrated in FIG. 4G.

The third p-type dopant material 434 is typically a heavy atom species. Suitable third p-type dopant materials 434 are, for example, indium and gallium species.

The implant parameters are selected in consideration of the desired profile of the third p-type dopant region 436. Typically, the dopant dosages and implant energies are chosen so that the third p-type dopant region 436 is deeper and has a higher concentration of dopant atoms than the first p-type dopant region 423 but a lower concentration of dopant atoms than the second p-type dopant region 427. For many applications, suitable implant energies and dosages of a second p-type dopant material 424 range from about 5 to 60 keV and 2E15 ($2 \times 10^{15}$) to 5E15 ($5 \times 10^{15}$) dopant atoms/cm$^2$, respectively.

The fourth mask 432 is removed and the substrate 401 is typically annealed using, for example, an RTA process, to activate the p-type dopant material 422, 424, and 434 in the p-doped regions 423, 427, and 436. One exemplary anneal process includes an RTA treatment at, for example, 800 to 950° C. for, for example, 30 to 60 seconds.

Processing may subsequently continue with well-known fabrication steps, such as silicidation and contact formation, to complete the device structure. Depending on the type of silicidation used, an additional spacer may be formed.

Using the above process, PMOS source/drain regions of, for example, PMOS, CMOS, and BiCMOS devices can be more reliably controlled. In particular, the extent of lateral diffusion of the p-type dopant material in the PMOS source/drain regions can be reduced. Control over and reduced diffusion of PMOS source/drain regions is provided as a result of the low mobility of the heavy atom p-type dopant material, in combination with the diffusion-inhibiting characteristics of the amorphization region. All of these factors contribute to the formation of a PMOS device region with active regions that are not shorted-out due to diffusion of the p-type dopant material across the channel. This, for example, allows for aggressive scaling of PMOS or other devices.

The asymmetry in the doping of the two active regions of the PMOS transistor further improve the reliability of that device. The asymmetry reduces the injection of hot carriers into the gate electrode from the channel, especially when the lightly doped side is the drain of the device which is typically attached to a high voltage source. In addition, the light doping in one of the active regions helps to preserve the desired channel length because of reduced diffusion into the channel region.

While the above process is illustrated in conjunction with a CMOS device, the process is not so limited. The above process can be used to form a number of different semiconductor devices, including but not limited to PMOS, CMOS, and BiCMOS devices. As noted above, the present invention is applicable to the fabrication of a number of different devices in which PMOS source/drain regions are formed using heavy atom dopant material. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method for forming a PMOS device, comprising:
   (a) forming a gate electrode over a device region of a substrate;
   (b) forming spacers on sidewalls of the gate electrode;
   (c) forming active regions adjacent to the gate electrode by multiple implantations of p-type dopant material using at least one spacer as a mask for each implantation, the step of forming the active regions comprising:
      (i) selectively implanting a first p-type dopant material into active regions adjacent to the gate electrode using the spacers as a mask;
      (ii) removing at least a portion of one of the spacers and forming a thinner spacer on the gate electrode; and
      (iii) selectively implanting a second p-type dopant material, comprising a heavy atom species, into a first one of the active regions using the thinner spacer as a mask, wherein the heavy atom species is an indium or gallium species.

2. The method of claim 1, wherein a dopant dosage of the first p-type dopant material ranges from 8E14 to 2E15 dopant atoms/cm$^2$ and an implant energy ranges from 2 to 30 keV.

3. The method of claim 1, wherein a dopant dosage of the second p-type dopant material ranges from 3E15 to 8E15 dopant atoms/cm$^2$ and an implant energy ranges from 1 to 20 keV.

4. The method of claim 1, wherein forming spacers on sidewalls of the gate electrode comprises forming first spacers on the sidewalls of the gate electrode, and forming second spacers over the first spacers.

5. The method of claim 4, wherein the first spacers comprise a first spacer material and the second spacers comprise a second spacer material different from the first spacer material.

6. The method of claim 4, wherein removing at least a portion of the one of the spacers and forming a thinner spacer comprises removing one of the second spacers on the gate electrode leaving the first spacer as a thinner spacer on the gate electrode.

7. The method of claim 1, wherein removing at least a portion of the one of the spacers comprises removing one of the spacers on the gate electrode; and forming a thinner spacer on the gate electrode.

8. The method of claim 1, wherein selectively implanting the second p-type dopant material comprises forming a masking layer over a second one of the active regions.

9. The method of claim 1, wherein the first p-type dopant material is a boron species.

10. The method of claim 1, further comprising forming at least one additional spacer proximate to the gate electrode subsequent to selectively implanting the second p-type dopant material, and selectively implanting a third p-type dopant material into the active regions using at least the one of the spacers and the at least one additional spacer as a mask.

11. The method of claim 10, wherein forming at least one additional spacer comprises removing the spacers from the gate electrode subsequent to selectively implanting the second p-type dopant material, and forming additional spacers on sidewalls of the gate electrode.

12. The method of claim 10, wherein the third p-type dopant material is a gallium or indium species.

13. The method of claim 10, wherein a dopant dosage of the first p-type dopant material ranges from 5E13 to 7E14 dopant atoms/cm$^2$ and an implant energy ranges from 2 to 30 keV.

14. The method of claim 10, wherein a dopant dosage of the third p-type dopant material ranges from 2E15 to 5E15 dopant atoms/cm$^2$ and an implant energy ranges from 5 to 60 keV.

15. The method of claim 1, further comprising implanting an amorphizing dopant material into the active regions.

16. The method of claim 15, wherein the amorphizing dopant material is carbon, silicon, $N_2$, or combinations thereof.

17. A method for forming a CMOS device, comprising:
(a) forming at least one NMOS gate electrode over a NMOS device region of a substrate and at least one PMOS gate electrode over a PMOS device region of a substrate;
(b) forming spacers on sidewalls of the NMOS gate electrode and the PMOS gate electrode;
(c) selectively implanting a first n-type dopant material into NMOS active regions adjacent to the NMOS gate electrode using the spacers on the NMOS gate electrode as a mask;
(d) forming active regions adjacent to the PMOS gate electrode by multiple implantations of p-type dopant material using at least one spacer as a mask for each implantation, the step of forming the active regions comprising:
(i) selectively implanting a first p-type dopant material into PMOS active regions adjacent to the PMOS gate electrode using the spacers on the PMOS gate electrode as a mask;
(ii) removing at least a portion of one of the spacers on the PMOS gate electrode and forming a thinner spacer on the PMOS gate electrode; and
(iii) selectively implanting a second p-type dopant material, comprising a heavy atom species, into one of the PMOS active regions using the thinner spacer as a mask, wherein the heavy atom species is an indium or gallium species.

18. The method of claim 17, further comprising selectively implanting a second n-type dopant material into the NMOS active regions, the second n-type dopant material having a dopant dosage lower than the first n-type dopant material.

19. The method of claim 18, wherein the second n-type dopant material is selectively implanted prior to the first n-type dopant material.

20. The method of claim 17, further comprising implanting an amorphizing dopant material into the active regions.

21. The method of claim 1, wherein removing at least a portion of one of the spacer and forming a thinner spacer comprises removing at least a portion of one of the spacers leaving a remaining portion as a thinner spacer.

22. A method for forming a semiconductor device, comprising:
(a) forming a gate electrode over a first device region of a substrate;
(b) forming spacers on sidewalls of the gate electrode;
(c) forming active regions adjacent to the gate electrode by multiple implantations of p-type dopant material using at least one spacer as a mask for each implantation, the step of forming the active regions comprising:
(i) selectively implanting a first p-type dopant material into active regions adjacent to the gate electrode using the spacers as a mask;
(ii) removing at least a portion of only one of the spacers and forming a thinner spacer on the gate electrode; and
(iii) selectively implanting a second p-type dopant material, comprising a heavy atom species, into a first one of the active regions using the thinner spacer as a mask, wherein the heavy atom species is a gallium or indium species.

23. The method of claim 22, wherein forming spacers on sidewalls of the gate electrode comprises forming first spacers on the sidewalls of the gate electrode, and forming second spacers over the first spacers.

24. The method of claim 23, wherein removing at least a portion of only one of the spacers and forming a thinner spacer comprises removing only one of the second spacers on the gate electrode leaving a one of the first spacers as a thinner spacer on the gate electrode.

25. The method of claim 22, wherein removing at least a portion of only one of the spacers on the sidewalls of the gate electrode and forming a thinner spacer comprises removing one of the spacers on the gate electrode; and forming a thinner spacer on the gate electrode.

26. The method of claim 22, wherein removing at least a portion of one of the spacer and forming a thinner spacer comprises removing at least a portion of one of the spacers leaving a remaining portion as a thinner spacer.

27. The method of claim 22, wherein the heavy atom species is a gallium or indium species.

28. A method for forming a semiconductor device, comprising:

forming a gate electrode over a device region of a substrate;

forming first spacers on sidewalls of the gate electrode, the first spacers having a lateral width of 50 to 100 angstroms;

forming second spacers adjacent to the first spacers, the second spacers having a lateral width of 50 to 250 angstroms;

selectively implanting a first p-type dopant material into active regions adjacent to the gate electrode using the spacers as a mask;

removing at least a portion of only one of the second spacers and forming a thinner spacer; and selectively implanting a second p-type dopant material, comprising a heavy atom species, into a first one of the active regions using the thinner spacer as a mask, wherein the heavy atom species is a gallium or indium species.

29. The method of claim 28, wherein removing at least a portion of only one of the second spacers and forming a thinner spacer comprises removing only one of the second spacers leaving one of the first spacers as the thinner spacer.

30. The method of claim 28, wherein the second p-type dopant material is a gallium or indium species.

31. A method for forming a semiconductor device, comprising:

(a) forming a gate electrode over a device region of a substrate;

(b) forming spacers on sidewalls of the gate electrode;

(c) forming active regions adjacent to the gate electrode by multiple implantations of p-type dopant material using at least one spacer as a mask for each implantation, the step of forming the active regions comprising:

(i) selectively implanting a first p-type dopant material into active regions previously undoped with p-type dopant material and adjacent to the gate electrode using the spacers as a mask, wherein the dopant dosage of the first p-type dopant material ranges from 8E14 to 2E15 dopant atoms/cm$^2$;

(ii) removing at least a portion of only one of the spacers and forming a thinner spacer on the gate electrode; and (iii) selectively implanting a second p-type dopant material, comprising a heavy atom species, into a first one of the active regions using the thinner spacer as a mask, wherein the dopant dosage of the second p-type dopant material ranges from 3E15 to 8E15 dopant atoms/cm, wherein the heavy atom species is a gallium or indium species.

32. The method of claim 31, wherein the heavy atom species is a gallium or indium species.

33. The method of claim 22, wherein removing at least a portion of only one of the spacers comprises removing at least a portion of only one of the spacers on a first sidewall of the gate electrode without removing any portion of the spacers on a second sidewall of the gate electrode.

* * * * *